(12) United States Patent
Ohtsuji et al.

(10) Patent No.: US 11,960,449 B2
(45) Date of Patent: Apr. 16, 2024

(54) COMPUTER-READABLE RECORDING MEDIUM STORING INFORMATION PROCESSING PROGRAM, INFORMATION PROCESSING METHOD, AND INFORMATION PROCESSING APPARATUS

(71) Applicant: FUJITSU LIMITED, Kawasaki (JP)

(72) Inventors: Hiroki Ohtsuji, Yokohama (JP); Eiji Yoshida, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 29 days.

(21) Appl. No.: 17/748,424

(22) Filed: May 19, 2022

(65) Prior Publication Data

US 2023/0033921 A1 Feb. 2, 2023

(30) Foreign Application Priority Data

Jul. 27, 2021 (JP) ................... 2021-122441

(51) Int. Cl.
*G06F 16/174* (2019.01)
*H03M 7/30* (2006.01)
(52) U.S. Cl.
CPC ...... *G06F 16/1744* (2019.01); *H03M 7/6082* (2013.01)
(58) Field of Classification Search
CPC ................. G06F 16/1744; H03M 7/6082
USPC ........................................ 707/693
See application file for complete search history.

(56) References Cited

U.S. PATENT DOCUMENTS

| | | | | |
|---|---|---|---|---|
| 5,675,789 A | * | 10/1997 | Ishii | G06F 3/0601 708/203 |
| 6,816,942 B2 | * | 11/2004 | Okada | G06F 3/0674 711/170 |
| 7,937,550 B2 | * | 5/2011 | Morita | H04N 5/91 711/170 |
| 8,145,833 B1 | * | 3/2012 | Duan | G06F 12/08 711/104 |
| 9,141,632 B1 | * | 9/2015 | Ramesh | G06F 16/13 |
| 10,169,359 B1 | * | 1/2019 | Pinho | G06F 16/182 |
| 10,763,892 B1 | * | 9/2020 | Basov | G06F 16/22 |
| 2013/0235935 A1 | * | 9/2013 | Kang | H04N 19/152 375/E7.243 |

(Continued)

FOREIGN PATENT DOCUMENTS

| | | | | | |
|---|---|---|---|---|---|
| CN | 1127558 A | * | 7/1996 | .......... | H03M 7/3088 |
| CN | 112040874 A | * | 12/2020 | .......... | A61B 8/4472 |

(Continued)

*Primary Examiner* — Phuong Thao Cao
(74) *Attorney, Agent, or Firm* — ArentFox Schiff LLP

(57) ABSTRACT

A recording medium stores an information processing program for managing a plurality of storage devices and a plurality of servers. The program causes a computer to execute a process including: while changing a compression ratio setting, obtaining an actual compression ratio by using some of data pieces to be used by the plurality of servers and a decompression rate at which the servers decompress a compressed dataset in which the some data pieces are compressed; and determining the compression ratio setting to be used based on a maximum total bandwidth of the plurality of storage devices and a number of the plurality of servers by using the obtained actual compression ratio and the decompression rate for each of the compression ratio settings.

6 Claims, 13 Drawing Sheets

(56) References Cited

U.S. PATENT DOCUMENTS

| | | | |
|---|---|---|---|
| 2013/0275396 A1* | 10/2013 | Condict | H03M 7/30 |
| | | | 707/693 |
| 2013/0315497 A1* | 11/2013 | Wang | H04N 19/15 |
| | | | 382/251 |
| 2018/0300606 A1 | 10/2018 | Corkery et al. | |
| 2019/0332269 A1* | 10/2019 | Greenwood | G06F 3/065 |
| 2019/0339876 A1* | 11/2019 | Auvenshine | G06F 3/0644 |
| 2020/0250007 A1 | 8/2020 | Ke et al. | |
| 2021/0344971 A1* | 11/2021 | Chen | H04L 67/568 |
| 2022/0085827 A1* | 3/2022 | Takatsukasa | H03M 7/40 |
| 2023/0021108 A1* | 1/2023 | Yamamoto | G06F 16/172 |

FOREIGN PATENT DOCUMENTS

| | | | | |
|---|---|---|---|---|
| JP | 2003111077 A | * | 4/2003 | |
| KR | 20080105333 A | * | 12/2008 | |
| WO | WO-2008029474 A1 | * | 3/2008 | H04N 19/115 |

\* cited by examiner

FIG. 4

| COMPRESSION RATIO SETTING | ACTUAL COMPRESSION RATIO |
|---|---|
| 1 | 0.8 |
| 2 | 0.6 |
| 4 | 0.5 |
| ... | ... |

111

| COMPRESSION RATIO SETTING | DECOMPRESSION THROUGHPUT |
|---|---|
| 1 | 200 |
| 2 | 100 |
| 4 | 50 |
| ... | ... |

112

| COMPRESSION RATIO SETTING | ACTUAL COMPRESSION RATIO | DECOMPRESSION THROUGHPUT |
|---|---|---|
| 1 | 0.8 | 200 |
| 2 | 0.6 | 100 |
| 4 | 0.5 | 50 |
| ... | ... | ... |

| COMPRESSION SIZE | GROSS ACTUAL COMPRESSION RATIO |
|---|---|
| 1 | 0.9 |
| 10 | 0.75 |
| ... | ... |

| COMPRESSION SIZE | NODE NUMBER | TRANSFER TIME |
|---|---|---|
| 1 | 1 | 10 |
| 1 | 2 | 8 |
| 2 | 1 | 8 |
| 2 | 2 | 6 |
| ... | ... | ... |

COMPUTER-READABLE RECORDING MEDIUM STORING INFORMATION PROCESSING PROGRAM, INFORMATION PROCESSING METHOD, AND INFORMATION PROCESSING APPARATUS

CROSS-REFERENCE TO RELATED APPLICATION

This application is based upon and claims the benefit of priority of the prior Japanese Patent Application No. 2021-122441, filed on Jul. 27, 2021, the entire contents of which are incorporated herein by reference.

FIELD

The embodiments discussed herein are related to a computer-readable recording medium storing an information processing program, an information processing method, and an information processing apparatus.

BACKGROUND

Along with the recent advancement and spreading of the artificial intelligence (AI) technology, the AI technology has been increasingly utilized for image recognition, voice translation, and the like, thus increasing a demand for processing of a large amount of data. For example, it is desirable to use a larger amount of learning data in order to improve the inference accuracy. Against this background, the current calculation performance of a computer does not fully keep up with the amount of data to be processed. To address this, a technique has been developed in which multiple servers perform parallel learning to expand the amount of calculation without lowering learning accuracy.

For parallelization of the learning processing by division, there are two division methods. One of the methods is a data parallel method in which learning data is divided into pieces and servers share processing by using the different pieces of the learning data. The other one is a model parallel method in which a neural network is divided into regions and servers perform processing for their respective regions.

In the parallel learning using the data parallel method, divided learning data pieces are often placed in a shared storage, and each server to perform learning often, first before learning, performs staging by copying and acquiring learning data pieces from the shared storage, and then starts the learning. In this case, what data is transferred to which server varies depending on the number of calculation nodes.

Here, since a staging time is considered to be a part of the entire learning time, it is preferable to shorten the staging time as much as possible. One conceivable method for this is to reduce the size of learning data pieces to be staged. For example, in a case where the learning data pieces are not compressed, the bandwidth of the shared storage may be saturated and the staging may take time. In contrast, compression of the learning data pieces makes it possible to suppress the saturation of the bandwidth.

As data compression techniques, there is a technique of improving parallel execution performance in an environment where a machine learning function using a large amount of data is distributed. In this technique, a file size most effective for data compression is calculated based on metadata, and a set of jobs are assigned to each distributed set. There is another technique in which a deep neural network (DNN) module compresses and decompresses activation data to reduce the utilization of memory bus bandwidth between a neuron and a memory.

U.S. Patent Application Publication Nos. 2020/0250007 and 2018/0300606 are disclosed as related art.

SUMMARY

According to an aspect of the embodiments, a computer-readable recording medium storing an information processing program for managing a plurality of storage devices and a plurality of servers, the program causing a computer to execute a process comprising, while changing a compression ratio setting, obtaining an actual compression ratio by using some of data pieces to be used by the plurality of servers and a decompression rate at which the servers decompress a compressed dataset in which the some data pieces are compressed, and determining the compression ratio setting to be used based on a maximum total bandwidth of the plurality of storage devices and a number of the plurality of servers by using the obtained actual compression ratio and the decompression rate for each of the compression ratio settings.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 is a diagram illustrating generation of a compression ratio setting correspondence table;

FIG. 6 is a diagram illustrating an example of a gross actual compression ratio correspondence table;

FIG. 7 is a diagram illustrating an example of a transfer time correspondence table;

DESCRIPTION OF EMBODIMENTS

Figure 1:
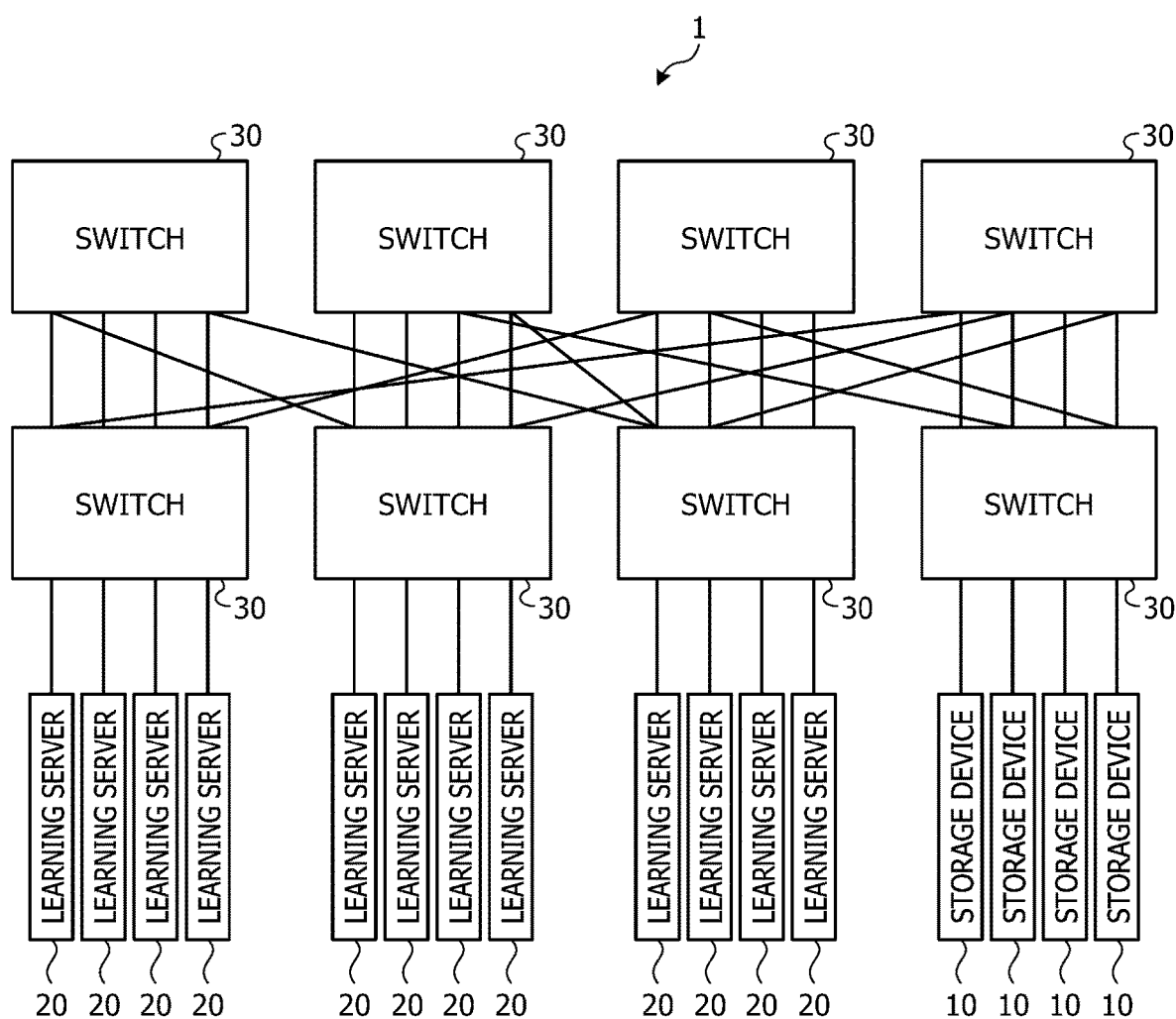
FIG. 1 is a system configuration diagram of a parallel learning system.

Although it is possible to reduce the size of the learning data pieces by lossless compression, the compression ratio has a trade-off relationship with a decompression rate and central processing unit (CPU) resources used therefor. For example, for determining a lossless compression algorithm, it is possible to select a compression method such as a dictionary coding or decoding and parameters such as a window size and a range for searching for duplicate data. Generally, when a compression method and parameters for a high compression ratio are selected, the amounts of computation requested for both compression and decompression increase.

For this reason, in a case where the learning data pieces are compressed without any consideration, there is a possibility that the decompression rate of the compressed data pieces is a bottleneck in the learning processing. For example, it is wrong that the higher the compression ratio and decompression rate, the better the efficiency of the staging. For example, the compression ratio to be selected for improving the efficiency of the staging varies depending on which is a bottleneck of the staging, the transfer bandwidth or the processing on the computer that performs the decompression. Since the optimum compression ratio setting depends on the bandwidth between the learning server and the shared storage, the actual compression ratio, and the decompression rate as described above, it is difficult to determine the optimum compression ratio in a stereotypical manner with a general data compression technique. For this reason, it is not easy to shorten the staging time by appropriately compressing the learning data pieces, and accordingly it is difficult to improve the efficiency of the learning processing.

In the technique for calculating the file size most effective for data compression based on the metadata, it is difficult to set an appropriate compression ratio due to a difficulty in adjusting the balance of the compression ratio with the decompression cost and the bandwidth. Further, the technique in which the DNN module compresses and decompresses activation data to reduce the utilization of memory bus bandwidth does not consider handling of learning data, and it is difficult to set an appropriate compression ratio. Accordingly, it is difficult to improve the processing efficiency of data processing by using any of the techniques.

A disclosed technique was conceived in view of such circumstances, and has an object to provide an information processing program, an information processing method, and an information processing apparatus that improve processing efficiency of data processing.

Hereinafter, the embodiments of an information processing apparatus, an information processing method, and an information processing program disclosed in this application will be described in detail with reference to the drawings. The following embodiments are not intended to limit the information processing apparatus, the information processing method, and the information processing program disclosed in this application.

Embodiments

FIG. 1 is a system configuration diagram of a parallel learning system. A parallel learning system 1 includes multiple storage devices 10 and multiple learning servers 20. The storage devices 10 and the learning servers 20 are coupled to each other via switches 30. A total network bandwidth of the learning servers 20 is sufficiently larger than a total throughput of the storage devices 10 as shared storages. The learning servers 20 evenly use the bandwidth for communication and the storage devices 10 evenly use the bandwidth for communication.

Each of the storage devices 10 stores learning data pieces to be used for learning by the learning servers 20. The storage device 10 uses some of the learning data piece to determine a compression ratio setting and a compression size in consideration of a balance of the compression ratio with the decompression cost and the bandwidth, and compresses and stores the learning data pieces in advance before the actual learning. The compression ratio setting is information specifying a compression ratio to be set in a compression algorithm to be used to compress learning data pieces.

For example, the compression ratio setting may take a value settable within a certain range for a compression archiver such as a range of 1 to 20, and is not in a form of a parameter indicating a compression ratio for a specific data compression method. For example, the compression ratio setting is given in advance such that a compression ratio setting 1 is a setting using a certain compression algorithm A and a parameter N or a compression ratio setting 2 is a setting using another compression algorithm B and a parameter M.

The compression size is a size of each compression unit for compressing a certain number of learning data pieces together. For example, the compression size is a value indicating how many learning data pieces are to be compressed together. For example, when a set of 10 learning data pieces is a compression unit, the compression size is 10.

Each of the learning servers 20 acquires by staging compressed learning datasets held by the storage device 10. The staging includes transferring a compressed learning datasets from the storage device 10 and decompressing the compressed learning datasets. The learning server 20 immediately decompresses the learning datasets transferred from the storage device 10. For example, the learning server 20 performs in parallel acquisition of learning datasets from the storage device 10 and decompression of the learning datasets. The multiple learning servers 20 perform learning by using the decompressed learning data pieces in cooperation with each other.

Figure 2:
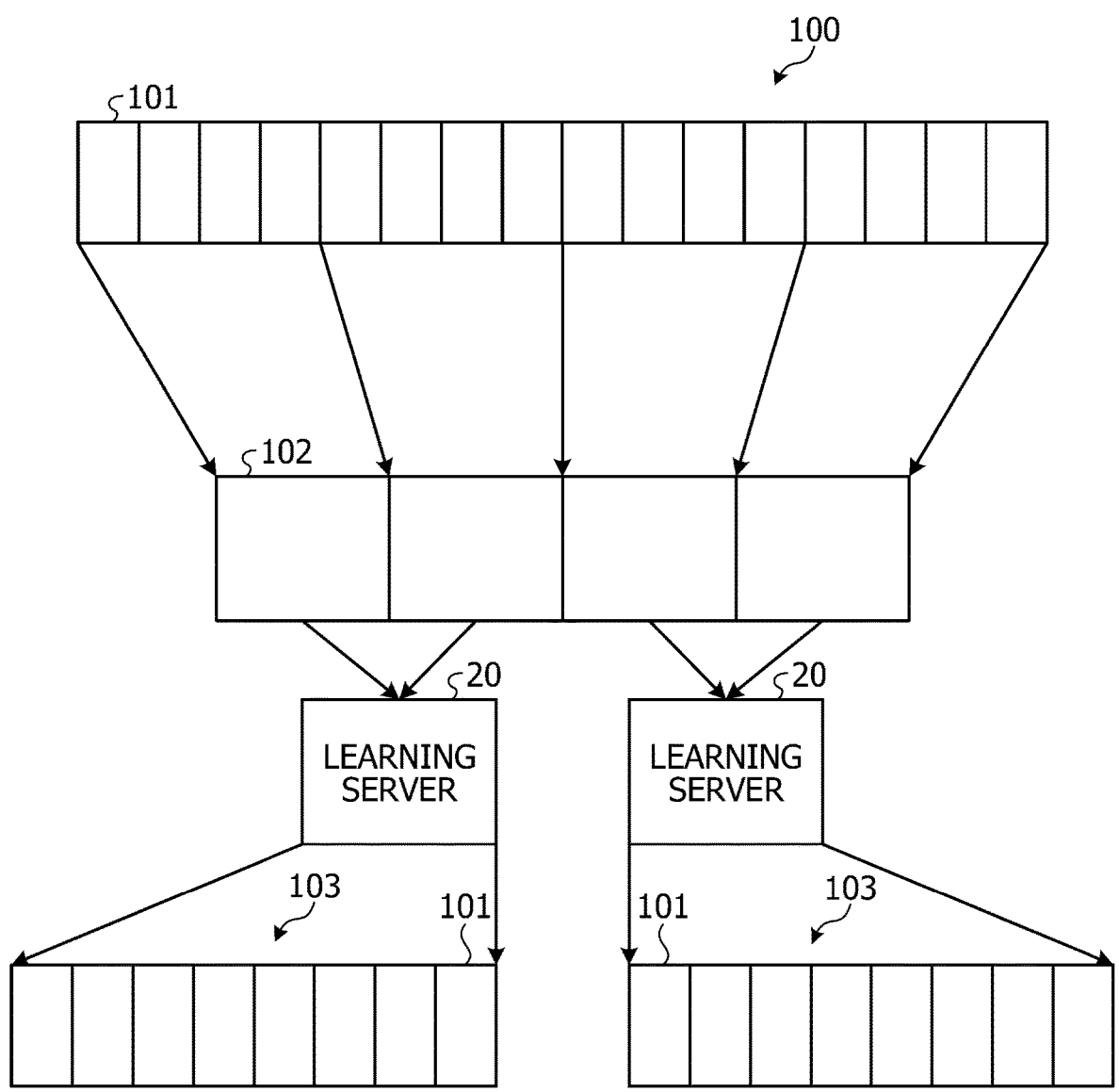
FIG. 2 is a diagram illustrating a sequence of compression and decompression of learning data pieces.

FIG. 2 is a diagram illustrating a sequence of compression and decompression of learning data pieces. States of learning data pieces in the parallel learning system 1 according to the present embodiment will be described herein with reference to FIG. 2.

As illustrated in FIG. 2, in the parallel learning system 1 according to the present embodiment, some of individual learning data pieces 101 in an entire learning data group 100 are grouped into a compressed learning dataset 102 and the compressed learning datasets 102 are transmitted to the learning servers 20. The compressed learning datasets 102 are decompressed in each of the learning servers 20 into a learning data subgroup 103 which is composed of multiple learning data pieces 101 and into which the learning data group is divided.

Figure 3:
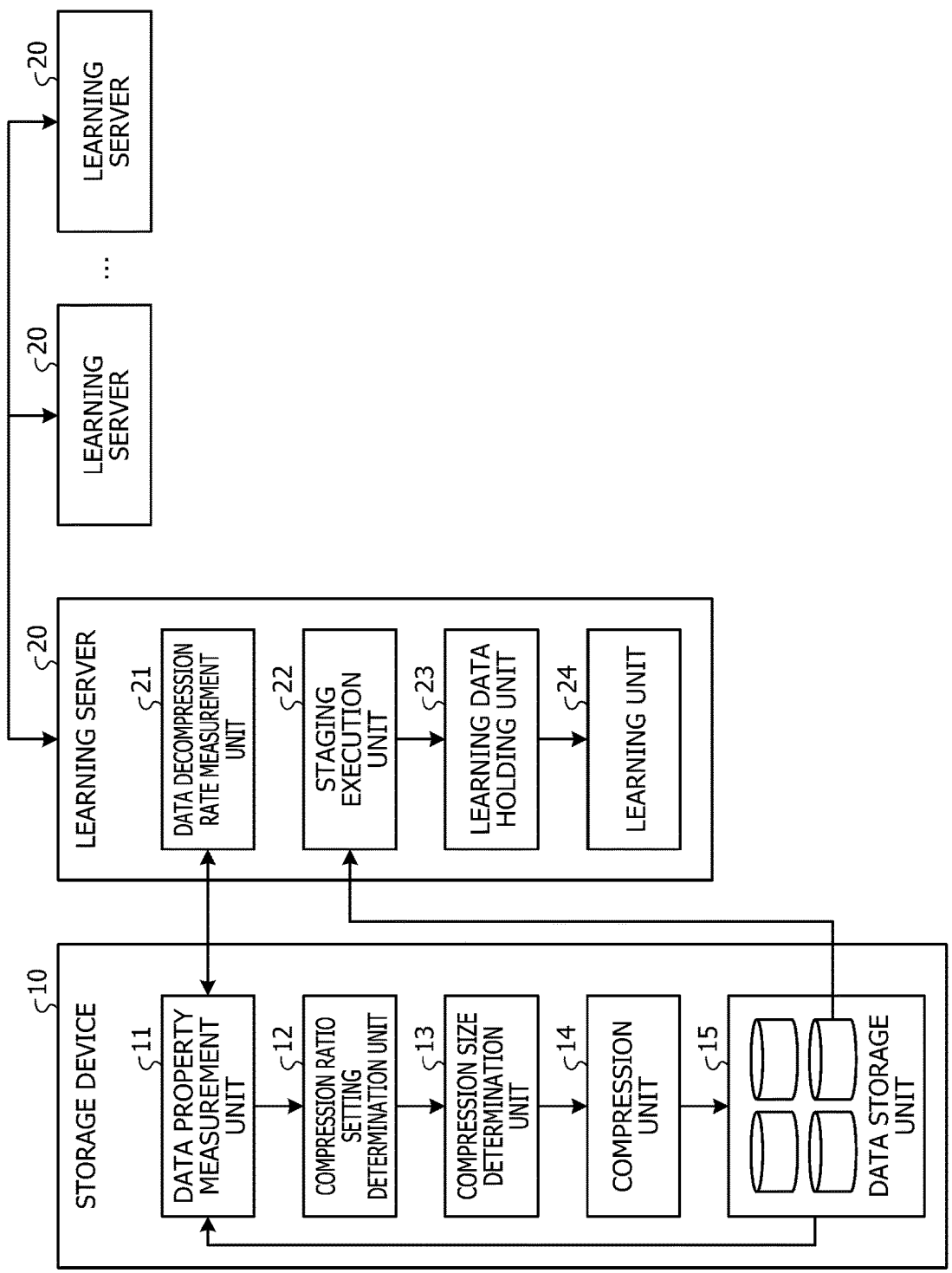
FIG. 3 is a block diagram of a storage device and a learning server.

FIG. 3 is a block diagram of the storage device and the learning server. Next, operations of the storage device 10 and the learning server 20 will be described below in detail with reference to FIG. 3.

As illustrated in FIG. 3, the storage device 10 includes a data property measurement unit 11, a compression ratio setting determination unit 12, a compression size determination unit 13, a compression unit 14, and a data storage unit 15.

The data storage unit 15 is a storage device. Multiple learning data pieces before compression are stored in the data storage unit 15. Then, the compressed learning datasets after compression are stored in the data storage unit 15.

The data property measurement unit 11 performs a learning data property determination process including: extracting some of the learning data pieces as a sample; and determining what degrees of compression ratio and decompression throughput the learning data pieces are actually compressed and decompressed under each of the compression ratio settings while changing the compression ratio setting from one to another. Hereinafter, the learning data property determination process by the data property measurement unit 11 will be described.

The data property measurement unit 11 extracts some of all the learning data pieces stored in the data storage unit 15. Next, the data property measurement unit 11 selects one compression ratio setting from among multiple usable compression ratio settings. The data property measurement unit 11 compresses the extracted some learning data pieces by using the selected compression ratio setting, thereby acquiring an actual compression ratio that is a real compression ratio. The actual compression ratio is a compression ratio at which data pieces are actually compressed under a specific compression ratio setting. For example, the data property measurement unit 11 obtains 0.8 or the like as an actual compression ratio in the case where the compression ratio setting is 1. This process by the data property measurement unit 11 corresponds to a process in which some of the learning data pieces 101 are grouped and compressed to generate the compressed learning dataset 102 in FIG. 2.

Next, the data property measurement unit 11 transmits, to any of the learning servers 20, the compressed learning dataset obtained by compressing the extracted some learning data pieces under the selected compression ratio setting. After that, the data property measurement unit 11 receives, from the learning server 20, a measurement result of a decompression throughput in the decompression of the transmitted compressed learning dataset. This process by the data property measurement unit 11 corresponds to a process in which the compressed learning datasets 102 are decompressed by the learning server 20 to generate the learning data subgroup 103 in FIG. 2.

The data property measurement unit 11 selects the compression ratio settings sequentially one by one, and acquires the actual compression ratios and the decompression throughputs under all the compression ratio settings. FIG. 4 is a diagram illustrating generation of a compression ratio setting correspondence table. The data property measurement unit 11 generates an actual compression ratio correspondence table 111 illustrated in FIG. 4 by listing up the correspondences between the respective compression ratio settings and the actual compression ratios obtained by the actual compression. The data property measurement unit 11 generates a decompression throughput correspondence table 112 illustrated in FIG. 4 by listing up the correspondences between the respective compression ratio settings and information pieces on the decompression throughputs acquired from the learning server 20. The data property measurement unit 11 combines the actual compression ratio correspondence table 111 and the decompression throughput correspondence table 112 to generate a compression ratio setting correspondence table 113. After that, the data property measurement unit 11 outputs the compression ratio setting correspondence table 113 to the compression ratio setting determination unit 12.

The compression ratio setting determination unit 12 receives input of the compression ratio setting correspondence table 113 from the data property measurement unit 11. The compression ratio setting determination unit 12 executes a compression ratio setting selection process of selecting a compression ratio setting that minimizes a time from transfer of the compressed learning datasets to completion of the decompression of the compressed learning datasets by using the compression ratio setting correspondence table 113. The compression ratio setting selection process by the compression ratio setting determination unit 12 will be described hereinafter.

The compression ratio setting determination unit 12 selects one row from the compression ratio setting correspondence table 113. Next, the compression ratio setting determination unit 12 calculates a requested time for the decompression process in the learning server 20 in a case of using the compression ratio setting in the selected row. The time calculated herein indicates a time taken to decompress the compressed learning datasets 102 and to generate the learning data subgroup 103 in FIG. 2.

For example, the compression ratio setting determination unit 12 obtains a size of learning data pieces to be used by each learning server 20 by dividing a learning data size, which is the total size of all the learning data pieces, by a learning node number, which is the number of the learning servers 20 that execute the parallel learning. Next, the compression ratio setting determination unit 12 divides the obtained size of the learning data pieces to be used by each learning server 20 by the decompression throughput in the learning server 20 to calculate the requested time for the decompression process in the learning server 20. The compression ratio setting determination unit 12 calculates a requested time T1 for the decompression process in the learning server 20 in accordance with (learning data size/N)/D, where N denotes the learning node number and D denotes the decompression throughput in the selected row.

Next, the compression ratio setting determination unit 12 calculates a staging time, which is a time requested to transfer and decompress all the learning data pieces, in the case of using the compression ratio setting in the selected row. The staging time calculated here indicates a time taken to transmit the compressed learning datasets 102 to the learning servers 20 and subsequently decompress the compressed learning datasets 102 in the learning servers 20 in FIG. 2.

For example, the compression ratio setting determination unit 12 multiplies the learning data size by the actual compression ratio to obtain a compressed size of all the learning data pieces. Next, the compression ratio setting determination unit 12 divides the compressed size of all the learning data pieces by the learning node number to calculate a data size to be transmitted to each learning server 20. A bandwidth for use to transfer compressed learning datasets between the storage devices 10 and each learning server 20 is the smaller value of a coupling bandwidth of the learning server 20 and a value of the total bandwidth of all the storage devices 10 divided by the learning node number. Accordingly, the compression ratio setting determination unit 12 calculates the requested time to transfer all the learning data pieces by dividing the data size to be transmitted to each learning server 20 by the smaller value of the coupling bandwidth of the learning server 20 and the value of the total bandwidth of all the storage devices 10 divided by the learning node number. Here, let N be the learning node number, C and P be the compression ratio setting in the selected row and its actual compression ratio, respectively, and T2 be the requested time to transfer the entire learning data. In this case, the compression ratio setting determination unit 12 calculates T2 in accordance with (learning data size×P/N)/min(the total bandwidth of the storage devices 10/N, the coupling bandwidth of the learning server 20).

As described above, each of the learning servers 20 performs in parallel the acquisition of the learning datasets transmitted from the storage devices 10 and the decompression of the acquired learning datasets. For example, the staging time is the longer one of a time for transmission of the learning datasets from the storage device 10 and a time for decompression of the learning datasets in the learning server 20. Accordingly, the compression ratio setting determination unit 12 selects a larger value of the requested time for the decompression process in the learning server 20 and the requested time for transfer of all the learning data pieces in the case of using the compression ratio setting in the selected row, and sets the larger value as a requested time in the case of using the compression ratio setting in the selected row. In a case where the learning node number is fixed to only one value, only one requested time is obtained. Instead, in a case where there are two or more possible values as the learning node number, the compression ratio setting determination unit 12 calculates the average of the requested times calculated in all the cases with the possible learning node numbers, and sets the average as the requested time in the case of using the compression ratio setting.

The compression ratio setting determination unit 12 selects the rows from the compression ratio setting correspondence table 113 sequentially one by one, and obtains the requested times in the respective cases of using the compression ratio settings in all the rows. The compression ratio setting determination unit 12 selects the compression ratio setting that minimizes the requested time as the compression ratio setting to be used. After that, the compression ratio setting determination unit 12 outputs information on the selected compression ratio setting and the compression ratio setting correspondence table 113 to the compression size determination unit 13.

The compression size determination unit 13 receives input of the information on the selected compression ratio setting and the compression ratio setting correspondence table 113 from the compression ratio setting determination unit 12. The compression size determination unit 13 selects a compression size that minimizes the staging time under the selected compression ratio setting by executing a compression size determination process as follows. When data pieces are grouped and compressed together, the compression ratio is sometimes increased. For this reason, in the compression size determination process, the compression size determination unit 13 actually measures and collects, using some sample data pieces, a relationship between an amount of data pieces and a compression ratio under the selected compression ratio setting. After that, the compression size determination unit 13 searches for a value of a compression size that minimizes the staging time, the compression size being a size of data pieces to be grouped and compressed together.

Figure 5:
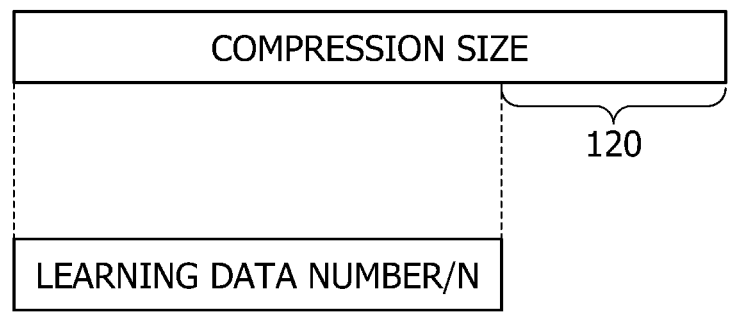
FIG. 5 is a diagram for explaining one limitation on a compression size.

In the search for the compression size that minimizes the staging time, it is desirable to consider the following two points. One of the points to be noted is that a waste may occur in data transfer when the compression size is large. FIG. 5 is a diagram for explaining one limitation on the compression size. In the case where the compression size is larger than the number of data pieces to be used for learning by each learning server 20, which is calculated by dividing the learning data number, which is the number of all the learning data pieces to be staged, by the learning node number, data pieces in a portion within a range 120 in FIG. 5 are not used for learning in the learning server 20 to which the learning data pieces are staged. For example, the data pieces in the portion within the range 120 are data pieces wasted even transmitted to the learning server 20, and the waste occurs in the data transfer.

The other point to be noted is that limitation due to meta access performance occurs when the learning server 20 accesses learning data pieces. Each of the learning servers 20 holds information on a location, a name such as a file name, and an access right for each file or directory, and this information is referred to as metadata. An access to this metadata is referred to as a meta access. A data access involves a meta access and meta access performance for making the meta access imposes a limitation. Description will be given of, for example, a metadata process of obtaining, from a path name, an identifier of the learning server 20 that holds an actual data piece and a data number. In this case, the learning server 20 has a table in which path names, server identifiers, and data numbers are associated with each other. By using this table, the learning server 20 is able to obtain a response to an inquiry using a path name. In the case of accessing a learning data piece, the learning server 20 performs an operation of referring to this table and an operation of accessing the actual data piece based on a result of the above referring operation. How many times the learning server 20 is able to perform these operations per second is meta access performance. Here, a total of throughputs between the learning server 20 and all the storage devices 10 is referred to as a total transfer throughput. When a value of the total transfer throughput of the learning server 20 divided by the compression size exceeds the meta access performance, the transfer rate is limited to a value of the meta access performance multiplied by a decompressed size that is calculated by dividing the compression size by the compression ratio. The data transfer in the staging is in the size with this limited rate, and the transfer throughput in the transfer is limited to a value of the compression size multiplied by the meta access performance because the transfer is performed before the decompression.

Hereinafter, description will be given of the compression size determination process by the compression size determination unit 13 in consideration of the above two points.

The compression size determination unit 13 determines an upper limit value of a compression size and performs a process of calculating gross actual compression ratios, each of which is a real compression ratio at which learning data pieces in the compression size are actually grouped and compressed together, while changing the compression size by incrementing it from 1 to the upper limit value by a predetermined value. It is preferable to determine the upper limit value within a practically applicable range. If the incrementation of the predetermined value is set to an addition of only one learning data piece or the like and the total number of learning data pieces is huge, the calculation therefor is difficult because an enormous amount of time is consumed. To avoid this, it is preferable to determine the predetermined value such that the amount of calculation may be within a processable amount.

For example, the compression size determination unit 13 sets the upper limit value of the compression size to a value of the learning data number, which is the number of all the learning data pieces to be staged, divided by 10 times the learning node number. The compression size determination unit 13 performs the following process while repeatedly selecting the compression size by changing it by every power of 2 (1, 2, 4, 8, 16, . . . ) within a range from 1 to the upper limit value of the compression size. The compression size determination unit 13 acquires learning data pieces in the selected compression size, compresses the learning data pieces under the selected compression ratio setting, and measures a gross actual compression ratio that is a real compression ratio. The compression size determination unit 13 generates a gross actual compression ratio correspondence table 130 illustrated in FIG. 6 by registering each compression size and the measurement result of the gross actual compression ratio in association with each other in the table. FIG. 6 is a diagram illustrating an example of the gross actual compression ratio correspondence table.

After the gross actual compression ratio correspondence table 130 is generated, the compression size determination unit 13 determines an upper limit value of the compression size and executes the following transfer time calculation process for each compression size while changing the compression size by incrementing it by a predetermined value within the range from 1 to the upper limit value.

First, the compression size determination unit 13 determines whether or not a value of the total transfer throughput of the learning server 20 divided by the selected compression size is larger than the meta access performance. When the value of the total transfer throughput of the learning server 20 divided by the selected compression size is larger than the meta access performance, the meta access is a bottleneck, and limits the transfer rate to a value of the compression size multiplied by the meta access performance. For this reason, the compression size determination unit 13 excludes the selected compression size from candidates for the compression size to be used, and proceeds to the transfer time calculation process for the next compression size.

On the other hand, when the value of the total transfer throughput of the learning server 20 divided by the selected compression size is equal to or smaller than the meta access performance, the compression size determination unit 13 executes the following process. The compression size determination unit 13 determines whether or not the selected compression size is equal to or larger than the number of learning data pieces to be used in each learning server 20, which is calculated by dividing the learning data number by the learning node number.

When the compression size is smaller than the number of learning data pieces to be used in each learning server 20, the compression size determination unit 13 calculates a size of learning data pieces per learning server 20 by dividing the learning data size, which is the total size of all the learning data pieces, by the learning node number. Next, the compression size determination unit 13 acquires the corresponding gross actual compression ratio from the gross actual compression ratio correspondence table 130, multiplies the size of learning data pieces per learning server 20 by the acquired gross actual compression ratio, and sets the obtained value as a transfer size of learning data pieces to be transmitted to each learning server 20. The compression size determination unit 13 calculates the transfer size in accordance with (learning data size/N)×P', where N denotes the learning node number and P' denotes the gross actual compression ratio.

When the compression size is equal to or smaller than the number of learning data pieces to be used in each learning server 20, the transmitted compressed learning dataset is entirely used in each learning server 20 without waste. Accordingly, the compression size determination unit 13 sets an effective transfer ratio coefficient representing a ratio of actually used data pieces to the transferred data pieces to 1.

When the compression size is larger than the number of learning data pieces to be used in each learning server 20, the compression size determination unit 13 calculates the transfer size of the learning data pieces to be transmitted to each learning server 20 by multiplying the compression size by the gross actual compression ratio. The compression size determination unit 13 calculates the transfer size in accordance with T×P', where T denotes the compression size and P' denotes the gross actual compression ratio.

When the compression size is equal to or larger than the number of learning data pieces to be used in each learning server 20, the number of learning data pieces actually used in each learning server 20 in the transmitted compressed learning dataset is a value of the learning data size divided by the learning node number. Accordingly, the compression size determination unit 13 sets, as an effective transfer ratio coefficient representing a ratio of actually used data pieces to the transferred data pieces, a ratio calculated in such a way that a value of the learning data size divided by the learning node number N is divided by a compressed size obtained by multiplying the compression size with the corresponding gross actual compression ratio. For example, the compression size determination unit 13 calculates the effective transfer ratio coefficient in accordance with (learning data size/N)/(T×P'), where N denotes the learning node number, T denotes the compression size, and P' denotes the gross actual compression ratio.

The compression size determination unit 13 calculates the throughput per learning server 20 by dividing the total throughput of the storage devices 10 by the learning node number. Next, the compression size determination unit 13 divides the calculated transfer size by the throughput per learning server 20 to calculate a tentative time for transferring all the learning data pieces. The compression size determination unit 13 calculates the transfer time by dividing the calculated tentative time by the effective transfer ratio coefficient. For example, the compression size determination unit 13 calculates the transfer time in accordance with (transfer size/(S/N))/effective transfer ratio coefficient, where S denotes the total throughput of the storage devices 10 and N denotes the learning node number.

The compression size determination unit 13 calculates the transfer time for each compression size, and generates a transfer time correspondence table 140 illustrated in FIG. 7 in which the compression size, the learning node number, and the transfer time are associated with each other. FIG. 7 is a diagram illustrating an example of the transfer time correspondence table.

After that, when the learning node number is fixed to one value, the compression size determination unit 13 refers to the transfer time correspondence table 140 and selects the compression size that minimizes the transfer time as the compression size to be used. When there are some possible values as the learning node number, the compression size determination unit 13 refers to the transfer time correspondence table 140, calculates the average value of the transfer times for each compression size, and selects the compression size that minimizes the calculated average value as the compression size to be used. After that, the compression size determination unit 13 outputs information on the compression ratio setting selected by the compression ratio setting determination unit 12 and the compression size selected by the compression size determination unit 13 to the compression unit 14.

From the compression size determination unit 13, the compression unit 14 receives input of the information on the compression ratio setting selected by the compression ratio setting determination unit 12 and the compression size selected by the compression size determination unit 13. The compression unit 14 compresses the learning data pieces stored in the data storage unit 15 by using the selected compression size and the selected compression ratio setting, thereby generating compressed learning datasets, and storing the compressed learning datasets in the data storage unit 15.

As illustrated in FIG. 3, the learning server 20 includes a data decompression rate measurement unit 21, a staging execution unit 22, a learning data holding unit 23, and a learning unit 24.

For each compression ratio setting, the data decompression rate measurement unit 21 receives, from the data property measurement unit 11 of the storage device 10, input of the compressed learning dataset in which the some learning data pieces extracted in the data property measurement process are compressed. Next, the data decompression rate measurement unit 21 decompresses the received compressed learning dataset and measures the decompression throughput for each compression ratio setting. After that, the data decompression rate measurement unit 21 transmits the measurement result of the decompression throughput for each compression ratio setting to the data property measurement unit 11.

The staging execution unit 22 of each of the learning servers 20 acquires, from the data storage unit 15 of the storage device 10, a compressed learning dataset including learning data pieces allocated to itself among compressed learning datasets compressed by the storage device 10. The staging execution unit 22 decompresses the acquired compressed learning dataset while performing the meta access process, and stores the decompressed data pieces in the learning data holding unit 23.

The learning units 24 of the respective learning servers 20 have the same learning model as a learning target. For example, a deep neural network (DNN) may be used as the learning model. Each of the learning units 24 learns the learning model by using the learning data pieces stored in the learning data holding unit 23 and calculates a weight update amount. The learning unit 24 performs communication with the other learning servers 20, calculates an average value of the weight update amounts calculated in the respective learning servers 20, and reflects the average value in the learning models owned by the learning units 24 of the respective learning servers 20.

Figure 8:
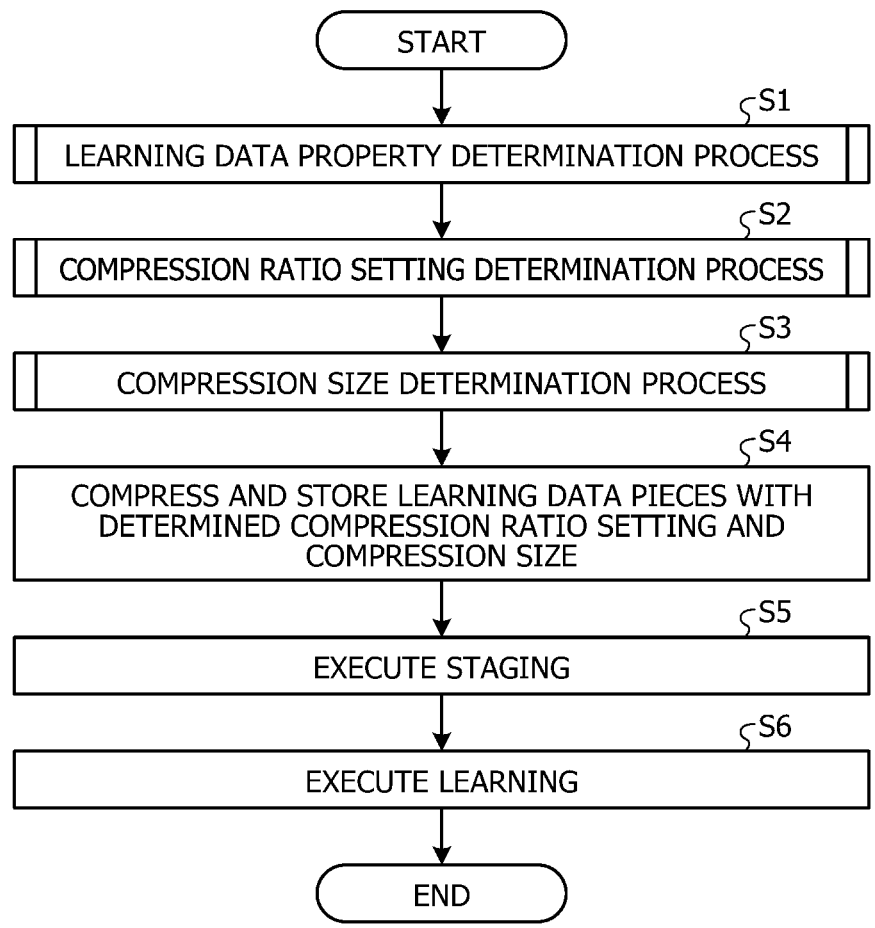
FIG. 8 is a flowchart of an overall learning process performed by a parallel learning system according to an embodiment.

FIG. 8 is a flowchart of an overall learning process performed by a parallel learning system according to an embodiment. Next, an overall sequence of the learning process by the parallel learning system 1 according to the embodiment will be described with reference to FIG. 8.

The data property measurement unit 11 of the storage device 10 executes a learning data property determination process by using the data decompression rate measurement unit 21 of the learning server 20 (step S1).

Next, the compression ratio setting determination unit 12 of the storage device 10 determines the compression ratio setting to be used by executing a compression ratio setting determination process using the compression ratio setting correspondence table 113 obtained in the learning data property determination process (step S2).

Next, the compression size determination unit 13 of the storage device 10 determines a compression size to be used by executing a compression size determination process using the compression ratio setting selected by the compression ratio setting determination unit 12 and the compression ratio setting correspondence table 113 (step S3).

The compression unit 14 compresses the learning data pieces by using the compression ratio setting selected by the compression ratio setting determination unit 12 and the compression size selected by the compression size determination unit 13 and stores the generated compressed learning datasets in the data storage unit 15 (step S4).

The staging execution unit 22 of the learning server 20 executes staging by acquiring and decompressing the compressed learning datasets stored in the data storage unit 15 of the storage device 10 and storing the decompressed learning data pieces into the learning data holding unit 23 (step S5).

The learning unit 24 of the learning server 20 acquires the learning data pieces from the learning data holding unit 23. The learning unit 24 executes learning of the learning model by using the acquired learning data pieces (step S6).

Figure 9:
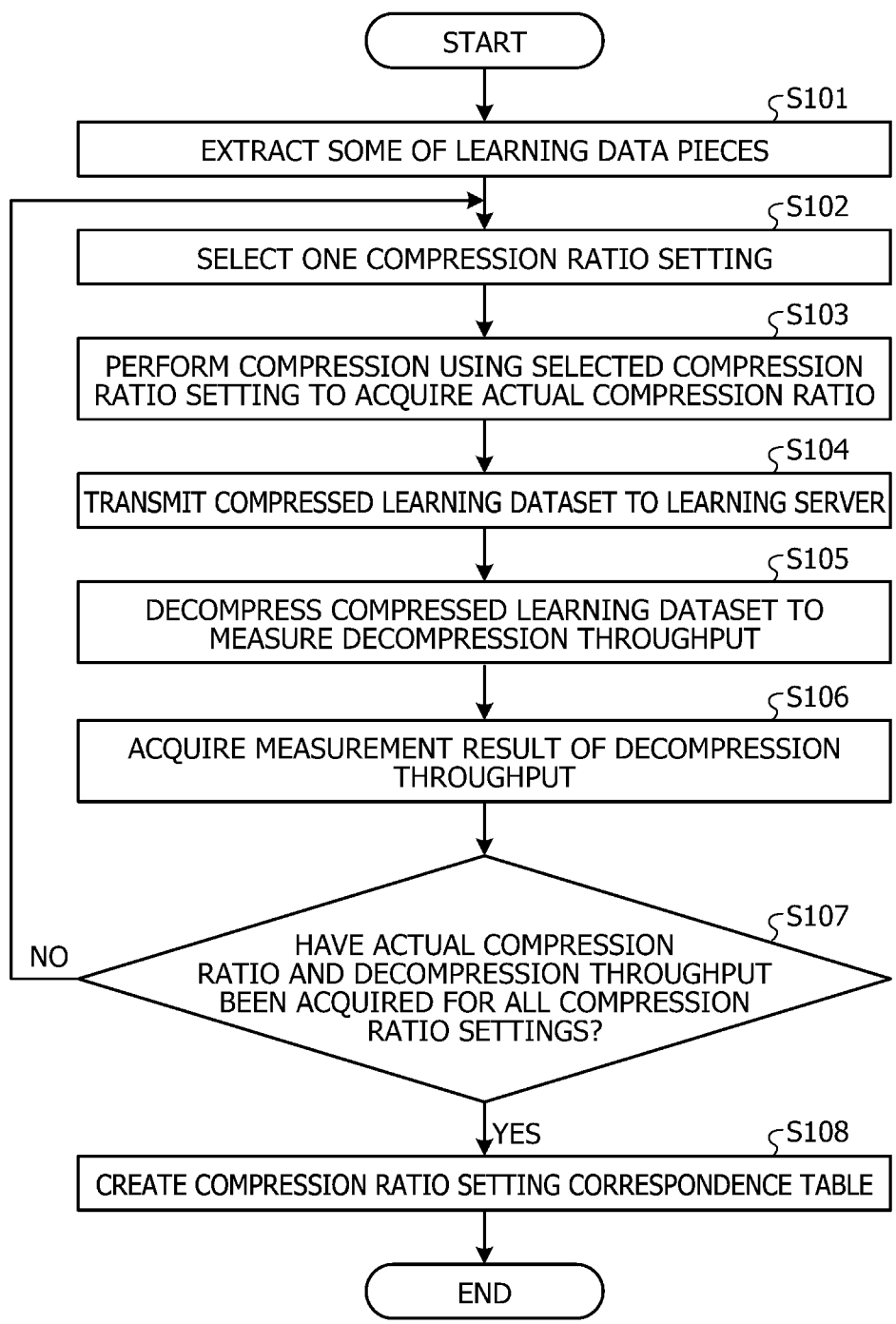
FIG. 9 is a flowchart of a learning data property determination process.

FIG. 9 is a flowchart of the learning data property determination process. Next, a sequence of the learning data property determination process will be described with reference to FIG. 9. Processes illustrated in the flowchart in FIG. 9 are examples of processes to be executed in step S1 in FIG. 8.

The data property measurement unit 11 extracts some of learning data pieces as a sample (step S101).

Next, the data property measurement unit 11 selects one compression ratio setting from among the existing multiple compression ratio settings (step S102).

The data property measurement unit 11 compresses the extracted some learning data pieces by using the selected compression ratio setting and acquires an actual compression ratio that is a real compression ratio (step S103).

The data property measurement unit 11 transmits, to the learning server 20, a compressed learning dataset in which the extracted learning data pieces are compressed by using the selected compression ratio setting (step S104).

The data decompression rate measurement unit 21 of the learning server 20 receives the compressed learning dataset from the data property measurement unit 11 of the storage device 10. The data decompression rate measurement unit 21 decompresses the received compressed learning dataset and measures the decompression throughput (step S105).

The data decompression rate measurement unit 21 transmits the measurement result of the decompression throughput to the data property measurement unit 11. The data property measurement unit 11 acquires the measurement result of the decompression throughput transmitted from the data decompression rate measurement unit 21 (step S106).

Next, the data property measurement unit 11 determines whether or not the actual compression ratios and the decompression throughputs have been acquired for all the compression ratio settings (step S107). When there is a compression ratio setting for which the actual compression ratio and decompression throughput have not been acquired (step S107: No), the data property measurement unit 11 returns to step S102.

On the other hand, when the actual compression ratios and the decompression throughputs have been acquired for all the compression ratio settings (step S107: Yes), the data property measurement unit 11 generates the actual compression ratio correspondence table 111 by listing up the correspondences between the respective compression ratio settings and the actual compression ratios. The data property measurement unit 11 generates the decompression throughput correspondence table 112 by listing up the correspondences between the respective compression ratio settings and the decompression throughputs. The data property measurement unit 11 combines the actual compression ratio correspondence table 111 and the decompression throughput correspondence table 112 to generate the compression ratio setting correspondence table 113 (step S108). After that, the data property measurement unit 11 outputs the compression ratio setting correspondence table 113 to the compression ratio setting determination unit 12.

Figure 10:
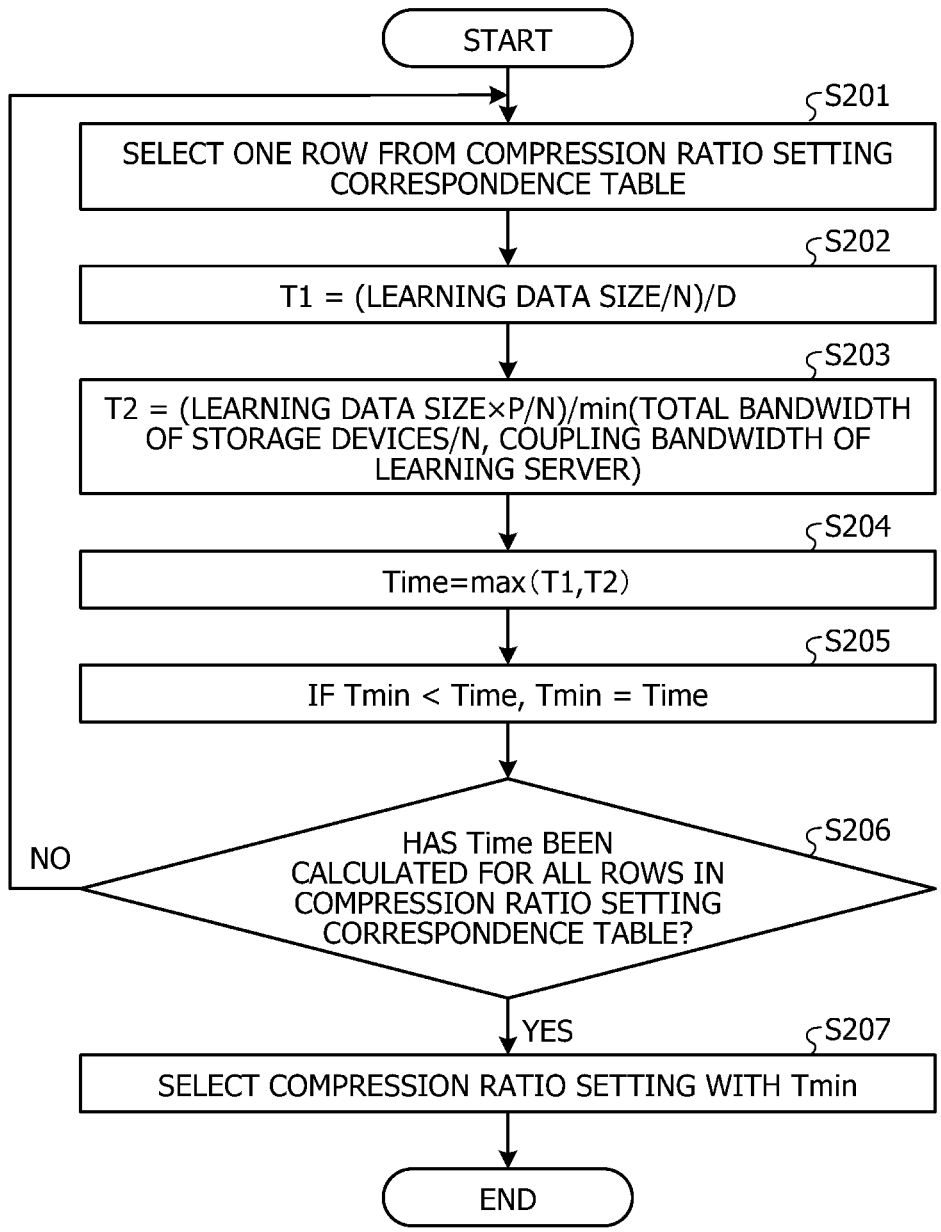
FIG. 10 is a flowchart of a compression ratio setting determination process.

FIG. 10 is a flowchart of the compression ratio setting determination process. Next, a sequence of the compression ratio setting determination process will be described with reference to FIG. 10. Processes illustrated in FIG. 10 are examples of processes to be executed in step S2 in FIG. 8.

The compression ratio setting determination unit 12 acquires the compression ratio setting correspondence table 113 from the data property measurement unit 11. Next, the compression ratio setting determination unit 12 selects one row from the compression ratio setting correspondence table 113 (step S201).

Next, the compression ratio setting determination unit 12 calculates a requested time for the decompression process in the learning server 20 in a case of using the compression ratio setting in the selected row. For example, the compression ratio setting determination unit 12 calculates a requested time T1 for the decompression process in the learning server 20 in accordance with T1=(learning data size/N)/D, where N denotes the learning node number and D denotes the decompression throughput in the selected row (step S202).

Next, the compression ratio setting determination unit 12 calculates, for example, a staging time, which is a requested time for transfer of all the learning data pieces, in the case of using the compression ratio setting in the selected row. In this case, the compression ratio setting determination unit 12 calculates a requested time T2 for transfer of all the learning data pieces in accordance with T2=(learning data size×P/N)/min (total bandwidth of storage devices 10/N, the coupling bandwidth of learning server 20), where N denotes the learning node number and P denotes the actual compression ratio in the selected row (step S203).

Next, the compression ratio setting determination unit 12 selects a larger value of the requested time for the decompression process in the learning server 20 and the requested time for transfer of all the learning data pieces in the case of using the compression ratio setting in the selected row, and sets the larger value as the requested time in the case of using the compression ratio setting in the selected row. For example, the compression ratio setting determination unit 12 calculates a requested time Time=max (T1, T2) where T1 denotes the requested time for the decompression process in the learning server 20, and T2 denotes the requested time for transfer of all the learning data pieces (step S204).

Next, when the requested time in the case of using the compression ratio setting in the selected row is less than the currently-held minimum requested time, the compression ratio setting determination unit 12 holds, as the minimum requested time, the requested time in the case of using the compression ratio setting in the selected row. When the minimum requested time is not held yet, the compression ratio setting determination unit 12 holds, as the minimum requested time, the requested time in the case of using the compression ratio setting in the selected row. For example, let Time be the requested time in the case of using the compression ratio setting in the selected row and Tmin be the minimum requested time. Then, if Tmin<Time, the compression ratio setting determination unit 12 sets Tmin=Time (step S205).

After that, the compression ratio setting determination unit 12 determines whether or not the requested times Time have been calculated for all the rows in the compression ratio setting correspondence table 113 (step S206). When there remains a row for which Time has not been calculated (step S206: No), the compression ratio setting determination unit 12 returns to step S201.

On the other hand, when Time has been calculated for all the rows (step S206: Yes), the compression ratio setting determination unit 12 selects the compression ratio setting corresponding to Tmin that is the minimum requested time among the calculated requested times, as the compression ratio setting to be used (step S207). After that, the compression ratio setting determination unit 12 outputs information on the selected compression ratio setting and the compression ratio setting correspondence table 113 to the compression size determination unit 13.

Figure 11:
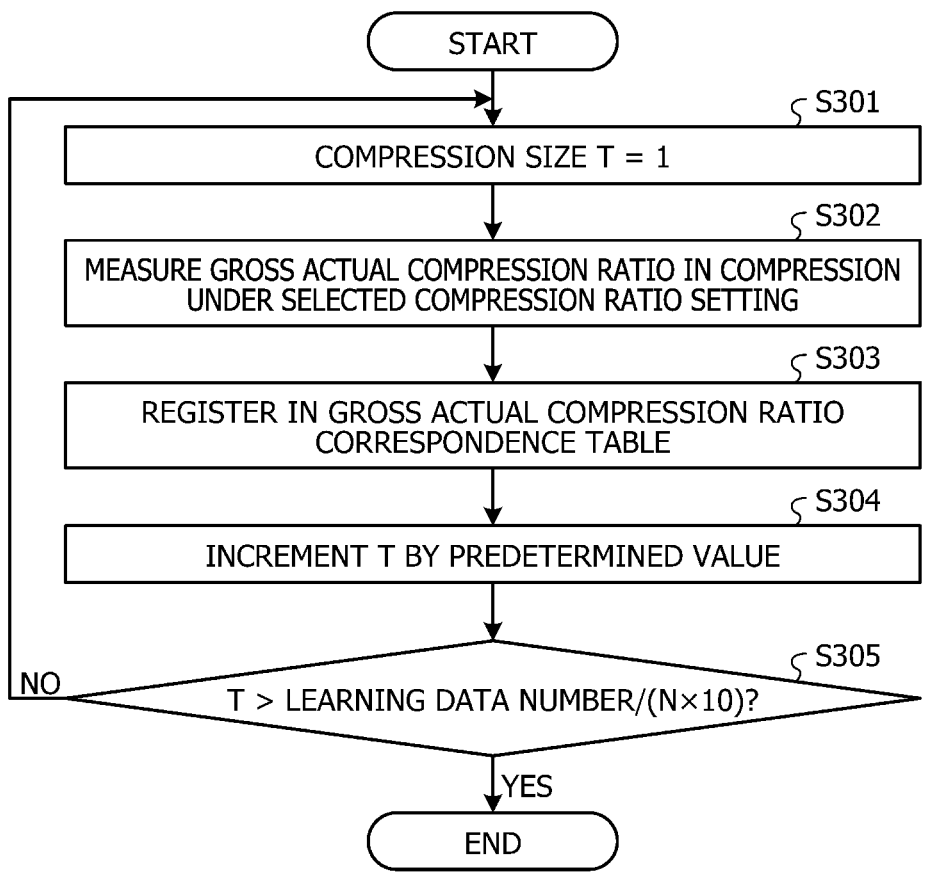
FIG. 11 is a flowchart of a creation process of the gross actual compression ratio correspondence table.
Figure 12:
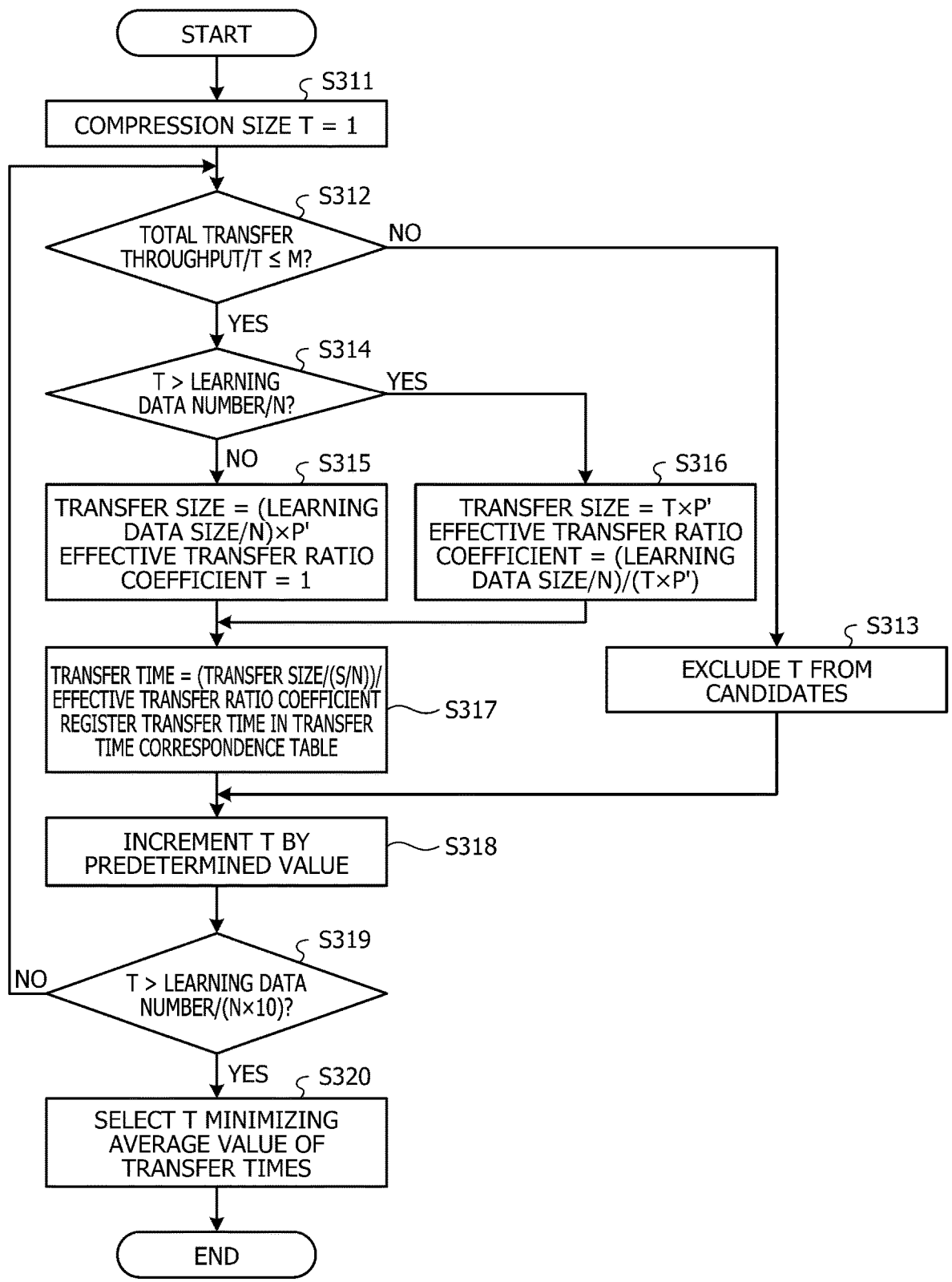
FIG. 12 is a flowchart of a compression size selection process.

FIG. 11 is a flowchart of a creation process of the gross actual compression ratio correspondence table. FIG. 12 is a flowchart of the compression size selection process. FIGS. 11 and 12 are examples of processes to be executed in the compression size determination process in step S3 in FIG. 8. With reference to FIG. 11, description will be given of a sequence of the creation process of the gross actual compression ratio correspondence table by the compression size determination unit 13.

The compression size determination unit 13 determines an upper limit value of the compression size. The compression size determination unit 13 sets a compression size T to 1 (step S301).

Next, the compression size determination unit 13 acquires learning data pieces in the number specified by the compression size T, compresses the learning data pieces under the compression ratio setting selected by the compression ratio setting determination unit 12, and measures a gross actual compression ratio that is a real compression ratio (step S302).

The compression size determination unit 13 registers the compression size T and the measurement result of the gross actual compression ratio in the gross actual compression ratio correspondence table 130 in association with each other (step S303).

Next, the compression size determination unit 13 increments the compression size T by a predetermined value (step S304). For example, the compression size determination unit 13 increments the compression size from 1 by every power of 2 (1, 2, 4, 8, 16, . . . ).

Next, the compression size determination unit 13 determines whether or not the compression size T exceeds the upper limit value of the compression size. For example, when a value of the learning data number divided by 10 times the node number N is set as the upper limit value, the compression size determination unit 13 determines whether or not T>the learning data number/(N×10) holds (step S305). If T≤the learning data number/(N×10) (step S305: No), the compression size determination unit 13 returns to step S301.

On the other hand, if T>the learning data number/(N×10) (step S305: Yes), the compression size determination unit 13 ends the creation process of the gross actual compression ratio correspondence table 130.

Next, with reference to FIG. 12, description will be given of a sequence of the compression size selection process by the compression size determination unit 13.

The compression size determination unit 13 sets the compression size T to 1 (step S311).

Next, the compression size determination unit 13 determines whether or not the value of the total transfer throughput of the learning server 20 divided by the selected compression size T is equal to or smaller than a meta access performance value M. For example, the compression size determination unit 13 determines whether or not the total transfer throughput/T M holds (step S312).

If the total transfer throughput/T>M (step S312: No), the compression size determination unit 13 excludes the selected compression size T from candidates for the compression size to be used (step S313). After that, the compression size determination unit 13 proceeds to step S318.

On the other hand, if the total transfer throughput/T M (step S312: Yes), the compression size determination unit 13 determines whether or not the compression size T is larger than the number of learning data pieces per learning server 20 calculated by dividing the learning data number by the node number N. For example, the compression size determination unit 13 determines whether or not T>the learning data number/N holds (step S314).

If T≤the learning data number/N (step S314: No), the compression size determination unit 13 calculates the size of learning data pieces per learning server 20 by dividing the learning data size, which is the total size of all the learning data pieces, by the learning node number. Next, the compression size determination unit 13 acquires the corresponding gross actual compression ratio from the gross actual compression ratio correspondence table 130, multiplies the size of learning data pieces per learning server 20 by the acquired gross actual compression ratio, and sets the obtained value as the transfer size. The compression size determination unit 13 calculates the transfer size in accordance with (learning data size/N)×P', where N denotes the learning node number and P' denotes the gross actual compression ratio. The compression size determination unit 13 sets an effective transfer ratio coefficient representing a ratio of actually used data pieces to the transferred data pieces to 1 (step S315).

On the other hand, if T>the learning data number/N (step S314: Yes), the compression size determination unit 13 calculates the transfer size per learning server 20 by multiplying the compression size by the gross actual compression ratio. For example, the compression size determination unit 13 calculates the transfer size in accordance with T×P', where T denotes the compression size and P' denotes the gross actual compression ratio. The compression size determination unit 13 sets, as an effective transfer ratio coefficient representing a ratio of actually used data pieces to the transferred data pieces, a ratio calculated in such a way that a value of the learning data size divided by the learning node number N is divided by a compressed size obtained by multiplying the compression size with the corresponding gross actual compression ratio. For example, the compression size determination unit 13 calculates the effective transfer ratio coefficient in accordance with (learning data size/N)/(T×P'), where N denotes the learning node number, T denotes the compression size, and P' denotes the gross actual compression ratio (step S316).

Next, the compression size determination unit 13 calculates a throughput per learning server 20 by dividing the total throughput of the storage devices 10 by the learning node number. Next, the compression size determination unit 13 divides the calculated transfer size by the throughput per learning server 20 to calculate a tentative time for transferring all the learning data pieces. The compression size determination unit 13 calculates the transfer time by dividing the calculated tentative time by the effective transfer ratio coefficient. For example, the compression size determination unit 13 calculates the transfer time in accordance with (transfer size/(S/N))/effective transfer ratio coefficient, where S denotes the total throughput of the storage devices 10 and N denotes the learning node number. The compression size determination unit 13 registers the calculated transfer time in the transfer time correspondence table 140 (step S317).

The compression size determination unit 13 increments the compression size T by a predetermined value (step S318). For example, the compression size determination unit 13 increments the compression size from 1 by every power of 2 (1, 2, 4, 8, 16, . . . ).

Next, the compression size determination unit 13 determines whether or not the compression size T exceeds the upper limit value of the compression size. For example, when a value of the learning data number divided by 10 times the node number N is set as the upper limit value, the compression size determination unit 13 determines whether or not T>the learning data number/(N×10) holds (step S319). If T≤the learning data number/(N×10) (step S319: No), the compression size determination unit 13 returns to step S312.

On the other hand, if T>the learning data number/(N×10) (step S319: Yes), the compression size determination unit 13 refers to the transfer time correspondence table 140 and calculates an average value of the transfer times for each compression size. The compression size determination unit 13 selects the compression size T that minimizes the calculated average value, as the compression size to be used (step S320). After that, the compression size determination unit 13 outputs information on the compression ratio setting selected by the compression ratio setting determination unit 12 and the compression size selected by the compression size determination unit 13 to the compression unit 14.

As described above, the storage device according to the present embodiment acquires the actual compression ratio and the decompression throughput of the learning data pieces for each compression ratio setting, and selects the compression ratio setting that minimizes the staging time. The storage device selects a compression size that minimizes the staging time in the case of the selected compression ratio setting, in consideration of the meta access performance and the presence of wasted transferred data pieces. The storage device compresses and holds the learning data pieces by using the selected compression ratio setting and compression size.

In a case where each learning data piece is stored as one file in a shared storage, the transfer rate may decrease due to a bottleneck of metadata access in the shared storage. To avoid this, instead of each learning data piece, a certain number of learning data pieces are grouped and compressed together. This makes it possible to reduce the load of access to metadata in the shared storage server and improve the compression efficiency. However, when an excessive number of data pieces are grouped, a situation may occur in which the entire compressed group has to be transferred even when only some of the data pieces are desired to be transferred. For this reason, it is preferable to change the number of data pieces to be grouped depending on a situation. For example, since the learning node number is not necessarily fixed for certain compressed learning datasets, it is preferable to select a compression data size optimal for each of various possible learning node numbers. In this regard, the storage device according to the present embodiment is capable of selecting an optimal compression data size by selecting a compression size that minimizes the staging time in consideration of the presence of wasted transferred data pieces.

For example, it is possible to minimize the requested time for the staging of learning data pieces by obtaining the compression ratio setting while considering the following three points: the property of the learning data pieces such as ease of compression; the decompression rate on the learning server; and the bandwidth of the shared storages where the learning data pieces are located. The compression of learning data pieces grouped in the possible maximum size makes it possible to minimize the staging time while considering the performance of the shared storages such as meta access and the occurrence of wasteful transfer. Accordingly, the learning server may shorten the staging time and improve the efficiency of data processing.

(Hardware Configuration)

Figure 13:
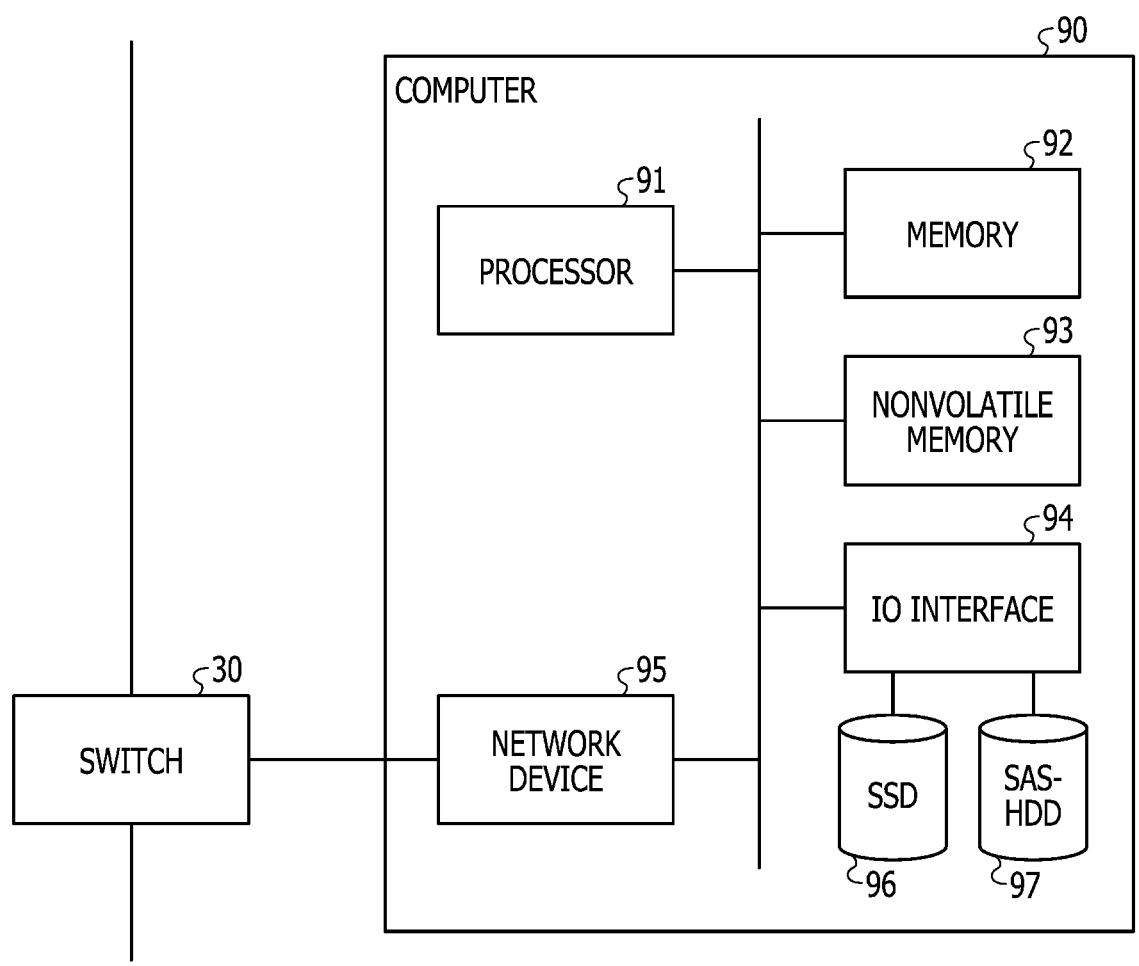
FIG. 13 is a diagram illustrating an example of a computer.

FIG. 13 is a diagram illustrating an example of a computer. For example, each of the storage devices 10 and the learning servers 20 may be implemented by a computer 90 illustrated in FIG. 13.

As illustrated in FIG. 13, the computer 90 includes a processor 91, a memory 92, a nonvolatile memory 93, an input/output (IO) interface 94, and a network device 95. To the IO interface 94, coupled are a solid-state drive (SSD) 96, a serial attached small computer system interface (SCSI)-hard disk drive (SAS-HDD) 97, and the like.

The processor 91 is coupled to the memory 92, the nonvolatile memory 93, the IO interface 94, and the network device 95 via a bus. The processor 91 is coupled to the SSD 96 and the SAS-HDD 97 via the IO interface 94.

The network device 95 is coupled to a switch 30. For example, the network device 95 is an interface for communication between the storage devices 10 and the learning servers 20 and communication between the learning servers 20. The processor 91 communicates with an external apparatus via the network device 95.

The memory 92 is a main storage device. As the memory 92, it is possible to use a dynamic random-access memory (DRAM) or the like. The nonvolatile memory 93 is an auxiliary storage device. As the nonvolatile memory 93, it is possible to use a read-only memory (ROM) or a flash memory.

The SSD 96 and the SAS-HDD 97 are auxiliary storage devices. The storage device 10 includes much more SSDs 96 and SAS-HDDs 97 than the learning server 20. The SSD 96 and the SAS-HDD 97 implement the functions of the data storage unit 15 and the learning data holding unit 23 illustrated in FIG. 3.

In the case of the storage device 10, the SSD 96 and the SAS-HDD 97 store various programs including an information processing program for implementing the functions of the data property measurement unit 11, the compression ratio setting determination unit 12, the compression size determination unit 13, and the compression unit 14 illustrated in FIG. 3. In the case of the learning server 20, the SSD 96 and the SAS-HDD 97 store various programs including an information processing program for implementing the functions of the data decompression rate measurement unit 21, the staging execution unit 22, and the learning unit 24 illustrated in FIG. 3.

The processor 91 reads each of the various programs stored in the SSD 96 and the SAS-HDD 97, develops the program in the memory 92, and executes the program. Thus, in the case of the storage device 10, the processor 91 implements the functions of the data property measurement unit 11, the compression ratio setting determination unit 12, the compression size determination unit 13, and the compression unit 14. In the case of the learning server 20, the processor 91 implements the functions of the data decompression rate measurement unit 21, the staging execution unit 22, and the learning unit 24.

Although the present embodiment is described such that the storage device 10 has the function of determining the compression ratio setting and the compression size of the learning data pieces, this function may be held by another information processing apparatus that manages the storage devices 10 and the learning servers 20. In this case, the information processing apparatus includes the data property measurement unit 11, the compression ratio setting determination unit 12, the compression size determination unit 13, and the compression unit 14 illustrated in FIG. 3. By using the learning data pieces held in the storage devices 10, the information processing apparatus determines the compression ratio setting and the compression size, and notifies the storage devices 10 of the determined compression ratio setting and compression size.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A non-transitory computer-readable recording medium storing an information processing program for managing a plurality of storage devices and a plurality of servers, the program causing a computer to execute a process comprising:

while changing a compression ratio setting, obtaining an actual compression ratio by using some of data pieces to be used by the plurality of servers and a decompression rate at which the plurality of servers decompress a compressed dataset in which the some data pieces are compressed;

determining the compression ratio setting to be used based on a maximum total bandwidth of the plurality of storage devices and a number of the plurality of servers by using the obtained actual compression ratio and the decompression rate for each of the compression ratio settings; and determining a division number by which the data pieces are to be divided for compression, based on a size of divided data pieces to be used by each of the servers among the data pieces, wherein the size is determined by repeatedly changing the size, compressing the divided data piece, and measuring the actual compression ratio.

2. The non-transitory computer-readable recording medium according to claim 1, wherein the determining of the division number is based on metadata processing performance of the plurality of storage devices in addition to the size of divided data pieces.

3. The non-transitory computer-readable recording medium according to claim 2, wherein the determining of the division number is based on an actual transfer rate based on the metadata processing performance of the plurality of storage devices.

4. The non-transitory computer-readable recording medium according to claim 1, wherein the process further comprising:

obtaining the actual compression ratio by generating the compressed dataset by compressing the some data pieces under each of the compression ratio settings;

transmitting the generated compressed dataset to any of the servers;

causing the servers to decompress the compressed dataset and measure the decompression rate; and acquiring a measurement result.

5. An information processing method for managing a plurality of storage devices and a plurality of servers, the method comprising:

while changing a compression ratio setting, obtaining an actual compression ratio by using some of data pieces to be used by the plurality of servers and a decompression rate at which any of the plurality of servers decompresses a compressed dataset in which the some data pieces are compressed;

determining the compression ratio setting to be used based on a maximum total bandwidth of the plurality of storage devices and a number of the plurality of servers by using the obtained actual compression ratio and the decompression rate for each of the compression ratio settings; and determining a division number by which the data pieces are to be divided for compression, based on a size of divided data pieces to be used by each of the servers among the data pieces, wherein the size is determined by repeatedly changing the size, compressing the divided data piece, and measuring the actual compression ratio.

6. An information processing apparatus for managing a plurality of storage devices and a plurality of servers, the information processing apparatus comprising:

a memory, and a processor coupled to the memory and configured to:

while changing a compression ratio setting, obtain an actual compression ratio by using some of data pieces to be used by the plurality of servers and a decompression rate at which any of the plurality of servers decompresses a compressed dataset in which the some data pieces are compressed;

determine the compression ratio setting to be used based on a maximum total bandwidth of the plurality of storage devices and a number of the plurality of servers by using the obtained actual compression ratio and the decompression rate for each of the compression ratio settings; and determine a division number by which the data pieces are to be divided for compression, based on a size of divided data pieces to be used by each of the servers among the data pieces, wherein the size is determined by repeatedly changing the size, compressing the divided data piece, and measuring the actual compression ratio.

* * * * *